(12) United States Patent
Krizman et al.

(10) Patent No.: US 9,904,760 B2
(45) Date of Patent: Feb. 27, 2018

(54) METHOD OF PRODUCING VEHICLE ORNAMENTATION

(71) Applicant: Ford Global Technologies, LLC, Dearborn, MI (US)

(72) Inventors: James F. Krizman, Dearborn, MI (US); Jeremy Howe, Grosse Ile, MI (US); Craig Daniel Scrupsky, Gibraltar, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 753 days.

(21) Appl. No.: 14/519,321

(22) Filed: Oct. 21, 2014

(65) Prior Publication Data
US 2016/0110493 A1   Apr. 21, 2016

(51) Int. Cl.
*G06F 17/50* (2006.01)
*B60R 13/00* (2006.01)

(52) U.S. Cl.
CPC ........ *G06F 17/5095* (2013.01); *B60R 13/005* (2013.01)

(58) Field of Classification Search
None
See application file for complete search history.

(56) References Cited

U.S. PATENT DOCUMENTS

| | | | |
|---|---|---|---|
| 6,766,206 B1 * | 7/2004 | Jasuja | G06F 17/5095 700/98 |
| 7,302,443 B2 | 11/2007 | Nakajima et al. | |
| 2011/0087466 A1 | 4/2011 | Vossmann | |
| 2012/0310910 A1 | 12/2012 | Haubach-Lippmann et al. | |
| 2013/0213555 A1 * | 8/2013 | Smead | B26F 1/3813 156/94 |

FOREIGN PATENT DOCUMENTS

| | | |
|---|---|---|
| CN | 103810345 | 5/2014 |
| KR | 101135814 | 4/2012 |

* cited by examiner

*Primary Examiner* — Syed Roni
(74) *Attorney, Agent, or Firm* — Jason C. Rogers; Bejin Bieneman PLC

(57) ABSTRACT

A method includes providing a computer aided design model including a panel model having a panel model surface and an ornamentation model having an ornamentation model surface facing the panel model surface. A respective distance in the computer aided design model is calculated between the ornamentation model surface and the panel model surface at discrete points on the ornamentation model surface. Each distance is compared to a tolerance to identify the discrete points at which the respective distance is outside of the tolerance. The ornamentation model surface at the discrete points at which the respective distance is outside of the tolerance is adjusted to bring the respective distance within the tolerance. The method includes manufacturing an ornamentation including points on a surface of the ornamentation corresponding to the discrete points on the ornamentation model surface that were adjusted to bring the respective distance within the tolerance.

15 Claims, 4 Drawing Sheets

METHOD OF PRODUCING VEHICLE ORNAMENTATION

BACKGROUND

A vehicle includes ornamentation attached to the exterior of the vehicle. For example, the ornamentation may include badges, e.g., identifying the make, model, manufacturer, etc., of the vehicle. Other examples of ornamentation include exterior molding, a grill, a spoiler, an aero shield, etc. Each ornamentation may be connected to an exterior panel of the vehicle. Adhesive may, in part, connect the ornamentation to the exterior panel. For example, the badge may be adhesively connected to a door panel, lift gate, deck lid, etc.

The adhesive connection between the ornamentation and the exterior panel is important to the performance and durability of the ornamentation. Specifically, a reliable adhesive connection ensures that the ornamentation remains attached to the panel during the lifetime of the vehicle. Both the panel and the ornamentation are rigid and, as such, the reliability of the connection is based on the fit of the ornamentation to the exterior panel, i.e., the closeness of the match in the shape of the ornamentation and the exterior panel. This fit affects the amount of contact, or lack thereof, of the adhesive with the ornamentation and the exterior panel and, thus, affects the reliability of the connection. The tolerances for successful adhesion are extremely tight making measurement reliability critical to successful ornamentation-to-panel adhesion performance.

From time to time, the design of any given vehicle model may be modified, e.g., to either freshen the design of the model or to completely redesign the model. When the design changes, the shape of the exterior panels of the vehicle may slightly change. Instead of completely redesigning the ornamentation, the cost of the design change of the vehicle may be reduced if the pre-existing ornamentation may be used with the new vehicle design and/or if the pre-existing ornamentation may be slightly modified for use with the new vehicle design.

Current techniques for analyzing the fit of the pre-existing ornamentation with the new design of the panels are unreliable, inaccurate, and time-consuming. For example, one technique includes taking sections normal to the boundary of the ornamentation in computer aided design (CAD) data of the ornamentation. This technique is not a comprehensive surface check, but instead, is limited to the points taken along the sections, thus reducing the accuracy.

Another method includes generating tessellated data representing the CAD data. In other words, a cloud point representation of the CAD data is generated. This tessellated data is used to visually depict the fit of the pre-existing ornamentation with the new design of the panel. This visual depiction may then be used to manually change the CAD data based merely on the visualization, i.e., the location of adjustments to the CAD data is made by estimation based on the visual depiction of the fit. In addition, this current technique provides false-positives data outputs resulting in inaccurate measurements, especially when such tight tolerances are required. Further, this current technique involves very large files, which may cause CAD software lock-up.

As such, an opportunity exists to establish an accurate and easy method for producing vehicle ornamentation that properly fits to exterior panels of the vehicle.

DETAILED DESCRIPTION

Figure 2:
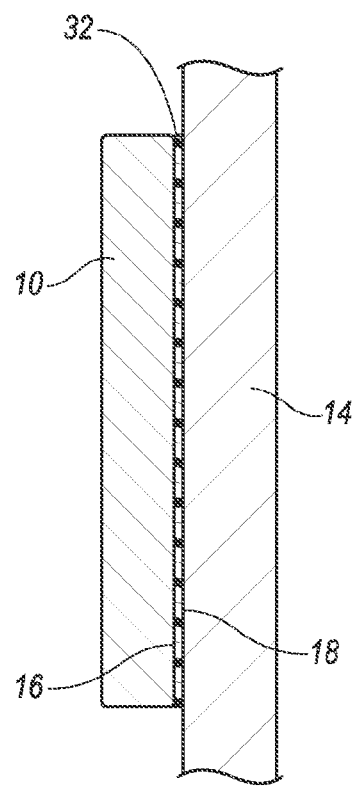
FIG. 2 is a cross-sectional view of one ornamentation and panel of FIG. 1 including adhesive between the ornamentation and the panel.
Figure 3:
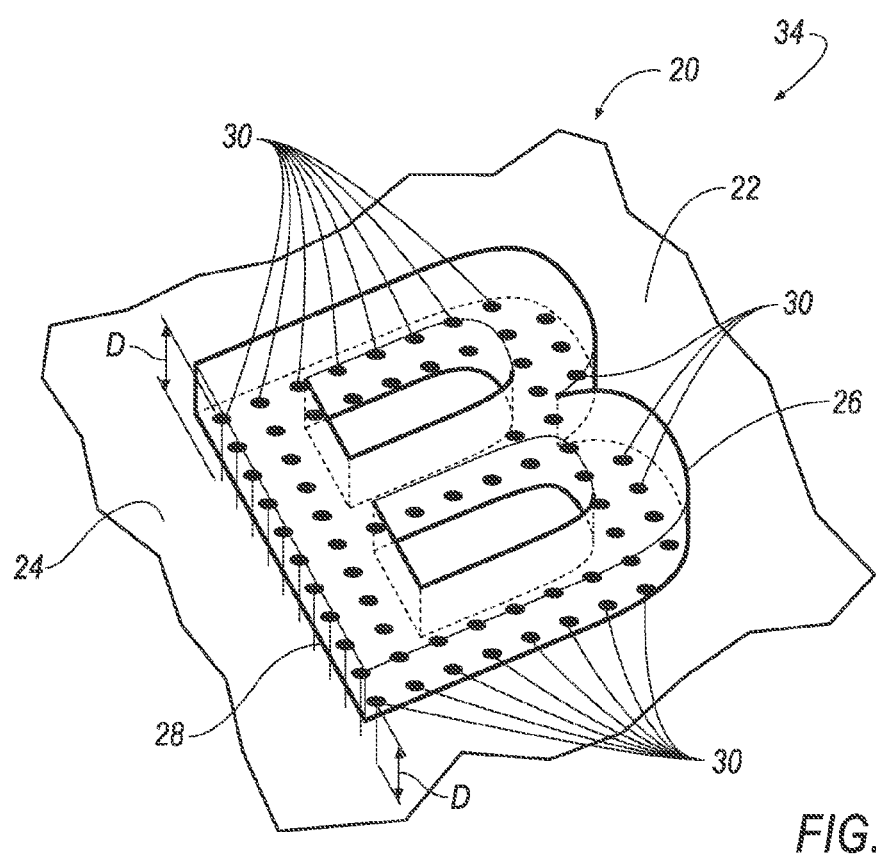
FIG. 3 is a screen shot of a display of a computer displaying a computer aided design (CAD) model, including an ornamentation model and a panel model, displayed in a CAD program.
Figure 4:
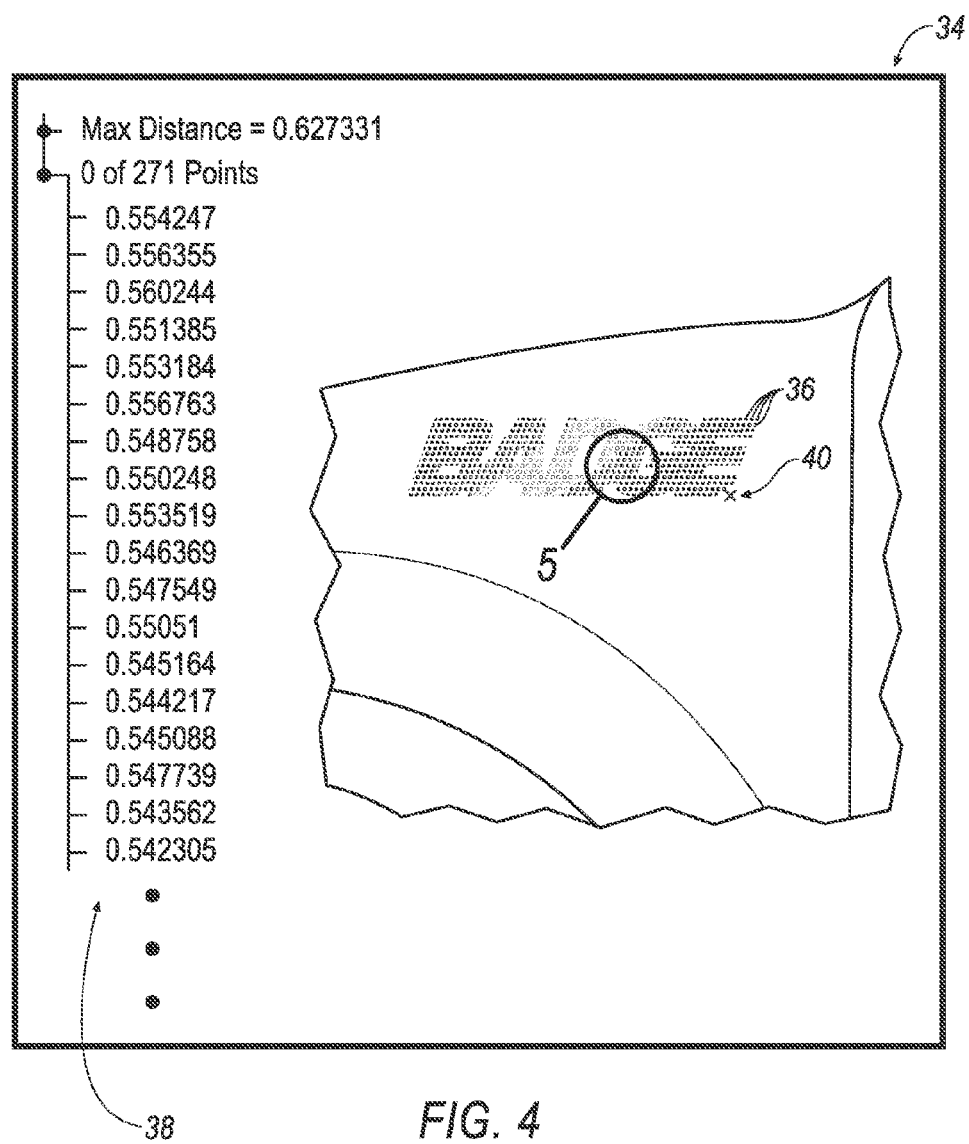
FIG. 4 is a screen shot of the display of the computer displaying display points corresponding to discrete points of the ornamentation model.
Figure 5:
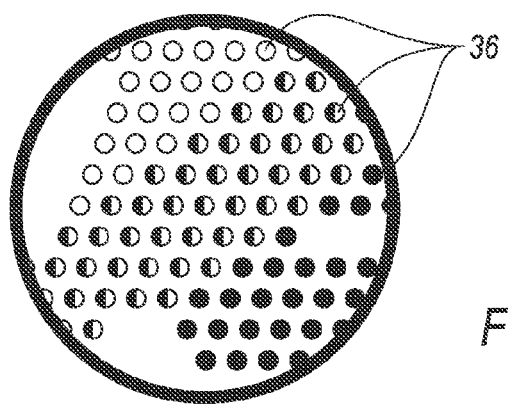
FIG. 5 is a magnified view of a portion of FIG. 4.

With reference to the Figures, wherein like numerals indicate like parts throughout the several views, a method of producing an ornamentation 10 for a vehicle 12 is described below. The ornamentation 10 is shown on the vehicle 12, for example, in FIG. 1. A cross-section of the ornamentation 10 on a panel 14 of the vehicle 12 is shown in FIG. 2. The ornamentation 10 presents an ornamentation surface 16 facing a panel surface 18 of the panel 14. The method includes the use of a computer aided design (CAD) program on a computer, as discussed further below. A screen shot of the CAD program is shown in FIGS. 3-5.

Figure 6:
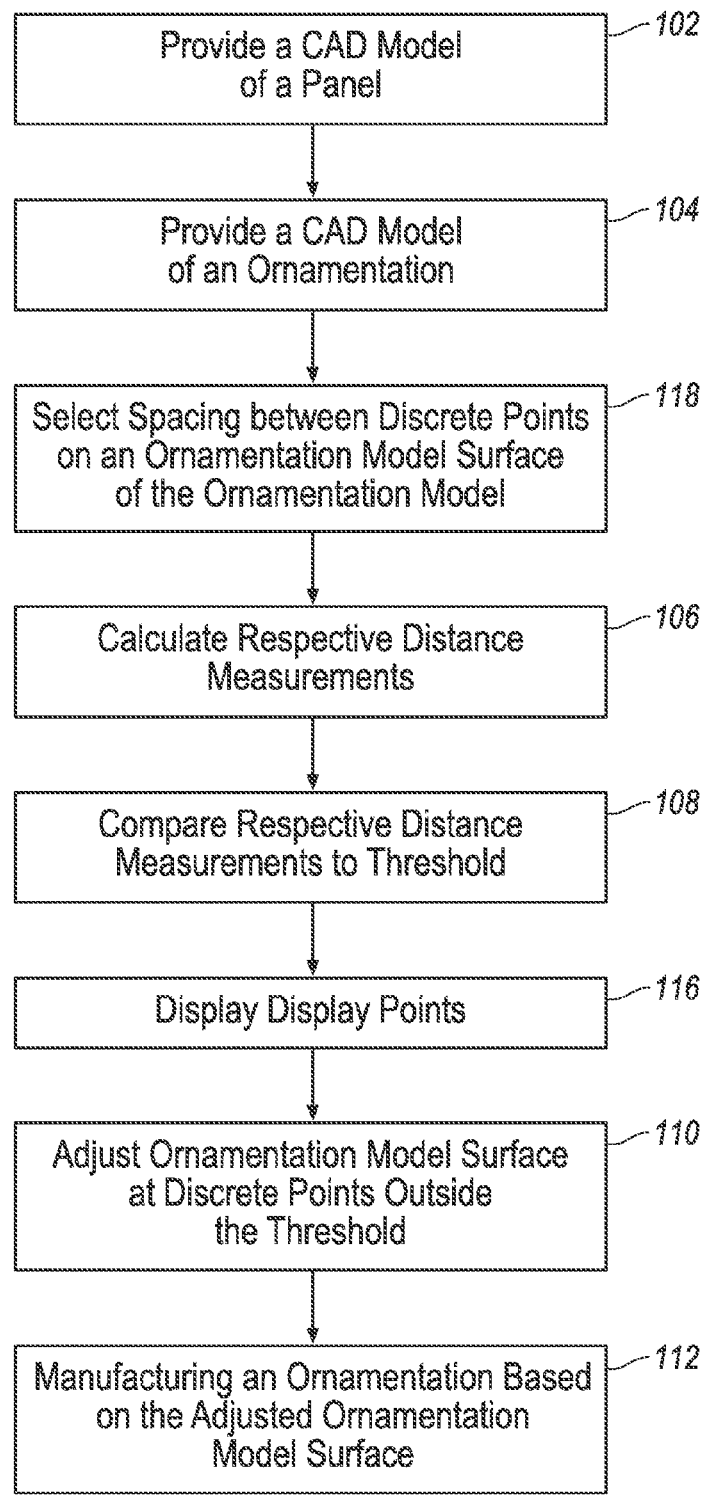
FIG. 6 is a flow chart of a method of producing the ornamentation.

With reference to FIG. 6 the method includes providing a CAD model 20 including a panel model 22 having a panel model surface 24, as shown in block 102, and an ornamentation model 26 having an ornamentation model surface 28 facing the panel model surface 24, as shown in block 104. In other words, the CAD model 20 includes a CAD model of the panel 14, i.e., the panel model 22, and a CAD model of the ornamentation 10, i.e., the ornamentation model 26. As shown in block 106, the method includes calculating respective distances D in the CAD model 20 between the ornamentation model surface 28 and the panel model surface 24 at discrete points 30 on the ornamentation model surface 28. As shown in block 108, the method includes comparing each respective distance D to a tolerance to identify ones of the discrete points 30 at which the respective distance D is outside of the tolerance. The method includes adjusting the ornamentation model surface 28 at the ones of the discrete points 30 at which the respective distance D is outside of the tolerance to bring the respective distance D within the tolerance, as shown in block 110. As shown in block 112, the method includes manufacturing the ornamentation 10 including points on a surface of the ornamentation 10 corresponding to the discrete points 30 on the ornamentation model surface 28 that were adjusted to bring the respective distance D within the tolerance.

Since the respective distances D are measured at the discrete points 30 of the CAD model 20, a respective distance D that is outside the tolerance may be identified with the discrete point 30 on the CAD model 20 at which that respective distance D was measured. Thus, this discrete point 30 associated with the respective distance D outside the tolerance may be adjusted to bring the respective distance D within the tolerance. In other words, discrete points 30 of the CAD model 20 of the ornamentation model surface 28 may be identified as having a respective distance D outside of the tolerance and the CAD model 20 may be adjusted to bring the respective distance D within the tolerance. This CAD model 20, i.e., the panel model 22 and the ornamentation model 26, is then used to manufacture the ornamentation 10 and the panel 14.

Associating each respective distance D with a discrete point 30 of the CAD model 20 provides a comprehensive surface check of the panel surface 18 and the ornamentation surface 16 to ensure that a desired fit between the panel surface 18 and the ornamentation surface 16 exists. This desired fit increases the durability and reliability of the ornamentation 10, i.e., ensures that the ornamentation 10 remains attached to the panel 14 during the lifetime of the vehicle 12.

Figure 1:
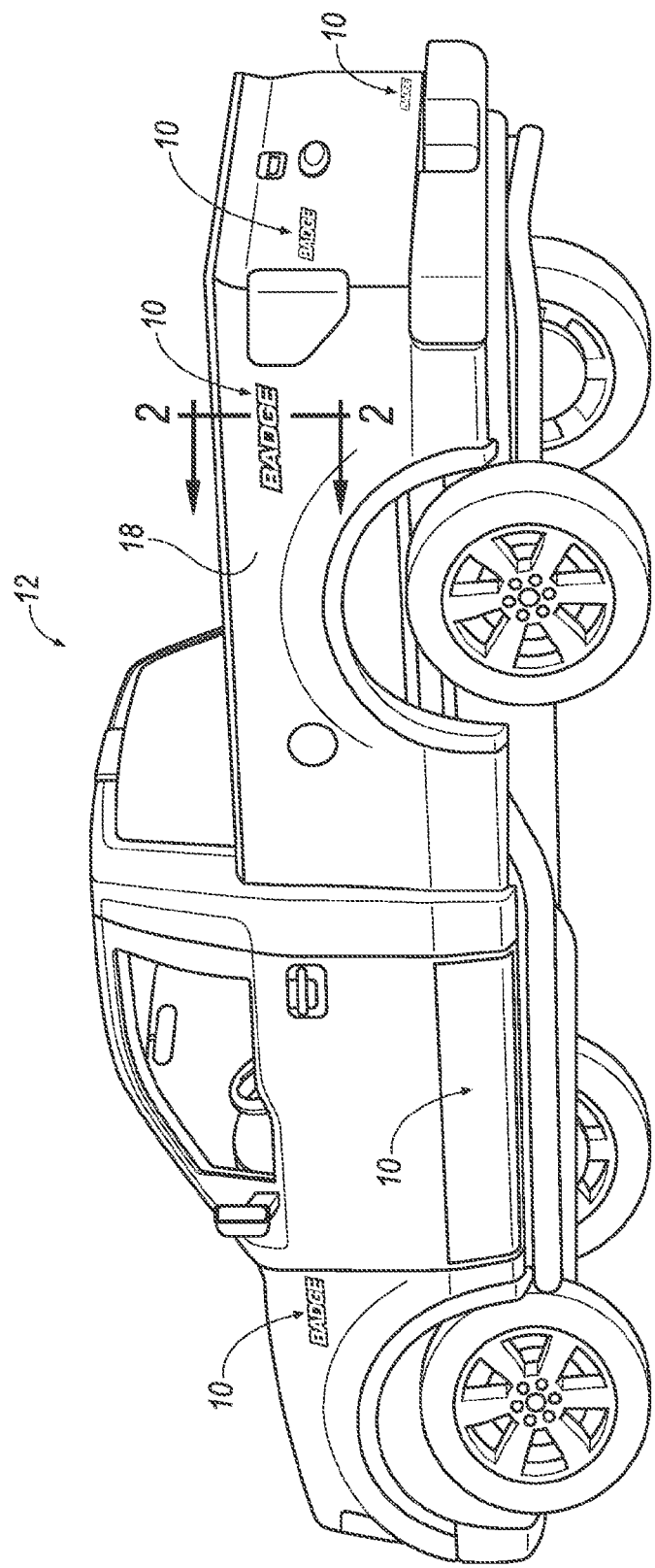
FIG. 1 is a perspective view of a vehicle with ornamentations on panels of the vehicle.

With reference to FIG. 1, the vehicle 12 may be any suitable type of vehicle 12 such as, for example, an automobile. The panel 14 of the vehicle 12 may be formed of metal, e.g., steel, or any other suitable material. The panel surface 18 of the panel 14, i.e., the exterior facing surface of the panel 14, may have any suitable shape.

The ornamentation 10 may be of any suitable type of ornamentation that is fixed to a panel 14 of the vehicle 12, e.g., external ornamentation. The ornamentation 10 may, for example, decorate the panel surface 18 of the panel 14. Alternatively, the ornamentation 10 may be functional. The vehicle 12 may include a plurality of ornamentations 10. For example, the ornamentations 10 of the vehicle 12 of FIG. 1 includes badges and exterior moldings. The badge, for example, may identify the make, model, manufacturer, etc., of the vehicle 12. Other examples of ornamentation 10 include a grill, a spoiler, an aero shield, etc.

The ornamentation 10 may be formed of any suitable material, e.g., plastic. The ornamentation surface 16 may have any suitable shape.

The panel 14 and the ornamentation 10 are both rigid, i.e., neither the panel 14 nor the ornamentation 10 conform to the shape of the other when the ornamentation 10 is assembled to the panel 14. Accordingly, the method of producing the ornamentation 10 provides the ability to create a desired fit between the panel surface 18 and the ornamentation surface 16, i.e., such that the panel surface 18 and the ornamentation surface 16 match each other sufficiently to allow for reliable and durable permanent attachment of the ornamentation 10 to the panel 14.

With reference to FIG. 2, the ornamentation 10 may be fixed to the panel 14 with adhesive 32. The adhesive 32 adheres to the panel surface 18 and to the ornamentation surface 16. The adhesive 32 may be of any suitable type. The method of producing the ornamentation 10 provides the ability to create the desired fit between the panel surface 18 and the ornamentation surface 16 to assure a reliable and durable adhesion of the ornamentation 10 to the panel 14 with the adhesive 32 for the life of the vehicle 12.

A portion of the CAD model 20 is shown on a display 34 of a computer in FIG. 3. The CAD model 20 may be provided to the CAD program in any suitable way. For example, an operator of the CAD program may access one or more CAD files that store the CAD model 20. The CAD model 20 may include geometric data representing the geometry of the panel 14 and the ornamentation 10, including the panel surface 18 and the ornamentation surface 16. In other words, the geometric data is a digital representation of the panel 14 and the ornamentation 10. The geometric data may be of any suitable type, such as CAD data. The CAD data may be for any type of modeling, such as wireframe modeling, surface modeling, solid modeling, etc. The CAD data may be of any suitable format. The CAD program may be any suitable program such as, for example, CATIA, AutoCAD, SolidWorks, etc.

As set forth above, the method includes manufacturing the ornamentation 10 based on the ornamentation model 26 of the adjusted CAD model 20, as shown in block 112 of FIG. 6. The method also includes manufacturing the panel 14 based on the panel model 22 of the CAD model 20. Specifically, the method of producing the ornamentation 10 includes manufacturing the panel 14 of the vehicle 12 with the geometric data of the panel surface 18 and manufacturing the ornamentation 10 with the geometric data of the ornamentation surface 16. The CAD model 20 may be used in any suitable way and/or with any suitable software to produce tooling for manufacturing the ornamentation 10 and the panel 14.

With reference to FIG. 3, each respective distance D may be the distance from ornamentation model surface 28 to the panel model surface 24 along a line normal to the ornamentation surface 16. In other words, each respective distance D may be along a line perpendicular to a tangent of the surface at a point of tangency. Each respective distance D may be measured by the CAD program.

Each respective distance D may be paired with the discrete point 30 at which the respective distance D is measured and each pairing of the discrete point 30 and respective distance D may be compiled in a geometric set, e.g., a table of paired discrete points 30 and respective distances D. Accordingly, the location of any given respective distance D may identified by the discrete point 30 associated with that respective distance D. In other words, if an operator of the CAD program wishes to view a discrete point 30 associated with a given respective distance D, the geometric set is used to identify that discrete point 30.

Once the CAD model 20 is accessed in the CAD program, the calculation of the respective distances D and the comparison of each respective distance D to a tolerance may be performed with a command in the CAD program. For example, the command may be a VBScript command added to the CAD program for performing the method.

The method includes choosing the tolerance. For example, the tolerance may be a range of 0.0-0.2 mm. For clarity, a respective distance D is within the tolerance if the respective distance D is between 0.0-0.2 mm and is outside the tolerance if the respective distance D is greater than 0.2 mm. The tolerance is designed to contact the adhesive 32 to the panel surface 18 in a durable and reliable manner. A display 36 of the computer may present a graphical user interface (GUI) that may include an input feature for manually choosing the tolerance.

The CAD program compares each respective distance D to the tolerance. For example, the CAD program may execute a sequence to calculate the respective distances D between the ornamentation model surface 28 and the panel model surface 24.

With reference to FIG. 6, the method includes displaying display points 36 corresponding to the discrete points 30, as shown in block 116. The display points 36 are shown in FIGS. 4 and 5. Specifically, the discrete points 30 may be displayed in a two-dimensional representation. The display points 36 may be displayed, for example, on the display 34 of the computer. A screen shot of the display 34 is shown in FIGS. 4 and 5. The relative spacing between the display points 36 may match the relative spacing between the discrete points 30 in the CAD model 20.

The display points 36 may indicate a comparison of the respective measurements to the tolerance. For example, display points 36 corresponding to discrete points 30 having respective distances D within the tolerance may be colored a first color, and display points 36 corresponding to discrete points 30 having respective distances D outside the tolerance may be colored a second color different than the first color. Different colors are identified in FIGS. 4 and 5 with dots of different amounts of shading for illustrative purposes. For example, the first color identifying respective distances within the tolerance is identified with unfilled dots in FIGS. 4 and 5, and the second color identifying respective distances D outside the tolerance is identified with filled dots in FIGS. 4 and 5.

Display points 36 corresponding to discrete points 30 having distance measurements both within the tolerance and within a preselected distance from being outside the tolerance may be colored a third color different than the first color and the second color. In other words, the display points 36 colored the third color are nearly outside the tolerance. The third color is identified with half-filled dots in FIGS. 4 and 5.

As shown in FIG. 4, numerical values of the respective distances D may be displayed in a list 38, e.g., on the display 34 of the computer. The list 38 may be displayed adjacent the display points 36, as shown in FIG. 4. A portion of the list 38 is shown in FIG. 4, as indicated by the ellipses at the bottom of the list 38. The numerical values may have any suitable number of digits after the decimal point. The values in the list 38 in FIG. 4 are provided merely for example.

The method may include identifying the largest respective distance D at any of the discrete points 30. For example, the method may include displaying an identification 40 of one display point 36 corresponding to one of the discrete points 30 at which the respective distance D is the largest, as shown in FIG. 4. The identification 40 may be, for example, an "X" or other identifying shape and/or may be identified with an identifying color. The location of the identification 40 shown in FIG. 4 is shown for example.

Additionally or alternatively, the method may include displaying an identification (not shown) of one of the numerical values in the list 38 corresponding to one of the discrete points 30 at which the respective distance D is the largest. For example, the identification of the largest numerical value may be identified with text formatting, e.g., bolding, italicizing, underlining, etc., and/or may be identified with an identifying color.

As set forth above, the method includes adjusting the ornamentation model surface 28 to bring the respective distance D within the tolerance, as shown in block 110. For example, the ornamentation model surface 28 may be moved toward the panel model surface 24 in areas near discrete points 30 that correspond to respective distance D measurements that are outside the tolerance.

After the respective distances D are determined, the ornamentation model surface 28 of the CAD model 20 may be automatically adjusted, i.e., by the CAD program, to bring the respective distances D at each discrete point 30 within the tolerance. Alternatively, after the respective distances D are determined, the ornamentation model surface 28 of the CAD model 20 may be manually adjusted. In other words, an operator may input instructions to the CAD program through the GUI of the computer to adjust the ornamentation model surface 28 of the CAD model 20 to a desired position, e.g., to bring the respective distances D at each discrete point 30 within the tolerance. The method adjusting the ornamentation surface 16 may include changing the geometric data of the ornamentation surface 16 to move the ornamentation surface 16 toward the panel surface 18.

As shown in FIGS. 4 and 5, i.e., the illustration of the display points 36 that correspond to the discrete points 30, the discrete points 30 may be spaced from each other in a repeating pattern. In other words, the discrete points 30 may be arranged in an array. As such, the display points 36 may be displayed in an array, i.e., in a repeating pattern, as shown in FIGS. 3 and 4. The discrete points 30, and thus the display points 36, may be equally spaced from each other.

With reference to FIG. 6, the method may include selecting the spacing between the discrete points 30, i.e., the density of discrete points 30 on the ornamentation model surface 28, as shown in block 118. The spacing between the discrete points 30 may be input to the CAD program, for example, with the GUI of the computer.

The method may include choosing a shape of display points 36. For example, the CAD program may include options, e.g., presented on the GUI of the computer, that the operator may choose to select the shape of the display points 36.

In operation, the operator of the CAD program may operate the CAD program to access one or more CAD files that store the CAD model 20. Once the CAD model 20 is accessed in the CAD program, the operator of the CAD program may select a command, e.g., a VBScript command, to operate the CAD program to calculate the respective distances D and to compare each respective distance D to the tolerance. The CAD program displays the array of display points 36 and/or the list 38 of numerals. The operator may view the display points 36 and/or the list 38 on the display 34 of the computer. The display points 36 and/or list 38 identify the discrete points 30 that are outside the selected tolerance.

Based on this information displayed on the display 34, the operator may manually or automatically move the ornamentation model surface 28 to move any points associated with respective distances D outside the tolerance toward the panel model surface 24. In other words, the operator may adjust the CAD model 20. This adjusted CAD model 20 is then used to manufacture the ornamentation 10. This method may be used, for example, to fit an existing ornamentation 10 to a panel 14 that is modified as a part of a vehicle 12 model redesign, e.g., to either freshen the design of the model or to completely redesign the model.

The disclosure has been described in an illustrative manner, and it is to be understood that the terminology which has been used is intended to be in the nature of words of description rather than of limitation. Many modifications and variations of the present disclosure are possible in light of the above teachings, and the disclosure may be practiced otherwise than as specifically described.

What is claimed is:

1. A method comprising:
   providing a computer aided design model including a panel model having a panel model surface and an ornamentation model having an ornamentation model surface facing the panel model surface;
   calculating respective distances in the computer aided design model between the ornamentation model surface and the panel model surface at discrete points on the ornamentation model surface;
   comparing each distance to a tolerance to identify ones of the discrete points at which the respective distance is outside of the tolerance;
   adjusting the ornamentation model surface at the ones of the discrete points at which the respective distance is outside of the tolerance to bring the respective distance within the tolerance;
   displaying display points corresponding to the discrete points;
   coloring the display points corresponding to ones of the discrete points having respective distances within the tolerance a first color and coloring display points corresponding to the ones of the discrete points at which the respective distance is outside the tolerance a second color different than the first color; and manufacturing an ornamentation including points on a surface of the ornamentation corresponding to the discrete points on the ornamentation model surface that were adjusted to bring the respective distance within the tolerance.

2. The method as set forth in claim 1 further comprising manufacturing a panel of the vehicle based on the panel model of the computer aided design model.

3. The method as set forth in claim 1 wherein adhesive is attached to the ornamentation surface and the tolerance is designed to contact the adhesive to the panel surface.

4. The method as set forth in claim 1 wherein the discrete points on the ornamentation model surface are spaced from each other in a repeating pattern.

5. The method as set forth in claim 4 wherein the discrete points are equally spaced from each other on the ornamentation model surface.

6. The method as set forth in claim 5 further comprising selecting the spacing between the discrete points.

7. The method as set forth in claim 1 wherein each respective distance is the distance from ornamentation surface to the panel surface along a line normal to the ornamentation surface.

8. The method as set forth in claim 1 further comprising coloring display points corresponding to ones of the discrete points having distances within the tolerance and within a preselected distance from being outside the tolerance a third color different than the first color and the second color.

9. The method as set forth in claim 8 further comprising displaying an identification of one display point corresponding to one of the discrete points at which the respective distance is largest.

10. The method as set forth in claim 1 further comprising displaying the respective distances in a list.

11. The method as set forth in claim 10 further comprising displaying an identification of one display point corresponding to one of the discrete points at which the respective distance is largest.

12. The method as set forth in claim 1 further comprising displaying display points corresponding to the discrete points in a two-dimensional representation.

13. The method as set forth in claim 1 further comprising displaying the respective distances in a list.

14. The method as set forth in claim 1 further comprising displaying an identification of one display point corresponding to one of the discrete points at which the respective distance is largest.

15. The method as set forth in claim 1 wherein the tolerance is 0.1-0.2 millimeters.

\* \* \* \* \*